US007806586B2

(12) United States Patent
Melamud et al.

(10) Patent No.: US 7,806,586 B2
(45) Date of Patent: Oct. 5, 2010

(54) COMPOSITE MECHANICAL TRANSDUCERS AND APPROACHES THEREFOR

(75) Inventors: Renata Melamud, Menlo Park, CA (US); Bongsang Kim, Mountain View, CA (US); Matt Hopcroft, San Francisco, CA (US); Saurabh Chandorkar, Stanford, CA (US); Manu Agarwal, Stanford, CA (US); Thomas W. Kenny, San Carlos, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 86 days.

(21) Appl. No.: 11/446,568

(22) Filed: Jun. 2, 2006

(65) Prior Publication Data

US 2007/0277620 A1    Dec. 6, 2007

(51) Int. Cl.
*G01K 11/22* (2006.01)
(52) U.S. Cl. ............................. 374/117; 374/E11.011
(58) Field of Classification Search ............... 73/24.06, 73/504.04–504.16, 766, 777; 333/186–200; 331/176, 156, 154; 374/E11.011, 117
See application file for complete search history.

(56) References Cited

U.S. PATENT DOCUMENTS

| | | | | |
|---|---|---|---|---|
| 5,612,249 A | * | 3/1997 | Sun et al. ..................... 438/297 |
| 6,119,518 A | * | 9/2000 | Itou et al. ................ 73/504.16 |
| 6,278,337 B1 | * | 8/2001 | Chan et al. .............. 73/504.14 |
| 6,557,419 B1 | | 5/2003 | Herb et al. |
| 6,987,432 B2 | | 1/2006 | Lutz et al. |
| 7,071,793 B2 | * | 7/2006 | Lutz et al. ................... 333/186 |
| 7,210,332 B2 | * | 5/2007 | Kolosov et al. ............ 73/24.06 |
| 7,369,003 B2 | * | 5/2008 | Hagelin ................. 331/116 M |
| 7,492,241 B2 | * | 2/2009 | Piazza et al. ................ 333/189 |
| 7,639,104 B1 | | 12/2009 | Quevy et al. |
| 2002/0047172 A1 | * | 4/2002 | Reid .......................... 257/415 |
| 2003/0020565 A1 | * | 1/2003 | Cornett et al. .............. 333/197 |
| 2005/0162239 A1 | | 7/2005 | Lutz et al. |
| 2006/0261915 A1 | * | 11/2006 | Lutz et al. ................... 333/186 |
| 2006/0290449 A1 | * | 12/2006 | Piazza et al. ................ 333/187 |
| 2007/0013464 A1 | * | 1/2007 | Pan et al. .................... 333/200 |

OTHER PUBLICATIONS

Candler et al. "Single Wafer Encapsulation of MEMS Devices" IEEE Transcations on Advanced Packaging, vol. 26, No. 3, Aug. 2003, pp. 227-232.*
Kim et al. "Frequency Stability of Wafer-Scale Encapsulated MEMS Resonators" Transducers '05, The 13th International Conference on Solid-State Sensors, Actuators and Microsystems, Jun. 5-9, 2005.*

(Continued)

*Primary Examiner*—Lisa M Caputo
*Assistant Examiner*—Jonathan Dunlap
(74) *Attorney, Agent, or Firm*—Crawford Maunu PLLC

(57) ABSTRACT

Mechanical transducers such as pressure sensors, resonators or other frequency-reference devices are implemented under conditions characterized by different temperatures. According to an example embodiment of the present invention, a combination of materials is implemented for mechanical transducer applications to mitigate temperature-related changes. In one application, a material property mismatch is used to facilitate single-anchor transducer applications, such as for resonators. Another application is directed to a Silicon-Silicon dioxide combination of materials.

21 Claims, 13 Drawing Sheets

OTHER PUBLICATIONS

Hopcroft et al. "Active Temperature Compensation for Micromachined Resonators" Solid0state Sensor, Actuator and Microsystems Workshop, Jun. 6-10, 2004.*

Kim et al. "Si-SiO2 Composite MEMS Resonators in CMOS Compatible Wafer-scale Thin-Film Encapsulation". Frequency Control Symposium, 2007 Joint with the 21$^{st}$ European Frequency and Time Forum, IEEE International. Oct. 1, 2007, pp. 1214-1219. Accessed Nov. 5, 2008.<http://ieeexplore.ieee.org/stamp/stamp.jsp?arnumber=4319270&isnumber=4318994>.*

Tarr, Martin. "Coefficient of Thermal Expansion". Publsihed Mar. 22, 2005. Accessed Nov. 5, 2008. <http://web.archive.org/web/20050322200419/http://www.ami.ac.uk/courses/topics/0197_cte/index.html>.*

H.J. Mcskimin. "Measurement of Elastic Constants at Low Temperatures by Means of Ultrasonic Waves—Data for Silicon and Germanium Single Crystals, and for Fused Silica." *Journal of Applied Physics*. Aug. 1953. vol. 24, No. 8. Aug. 1953, pp. 988-997.

M. B. Othman et al. "Electrothermally Excited Silicon Beam Mechanical Resonators." *Electronics Letters*. Jul. 2, 1987. vol. 23, No. 14, pp. 728-730.

R. Sandberg et al. "Temperature and pressure dependence of resonance in multi-layer microcantilevers." *Journal of Micromechanics and Microengineering*. Jun. 6, 2005. vol. 15, pp. 1454-1458.

F. Shen et al. "Thermal Effects on coated resonant microcantilevers." *Sensor and Actuators*. 2001. A-95, pp. 17-23.

B. S. Berry et al. "Temperature Compensation for Constant-Frequency Electromechanical Oscillators." IBM Technical Bulletin XP-002462194, vol. 14, No. 4 (Sep. 1971), pp. 1237-1238.

http://en.wikipedia.org/wiki/Elastic_modulus. "Elastic modulus." Wikipedia®, 1 pg.

\* cited by examiner

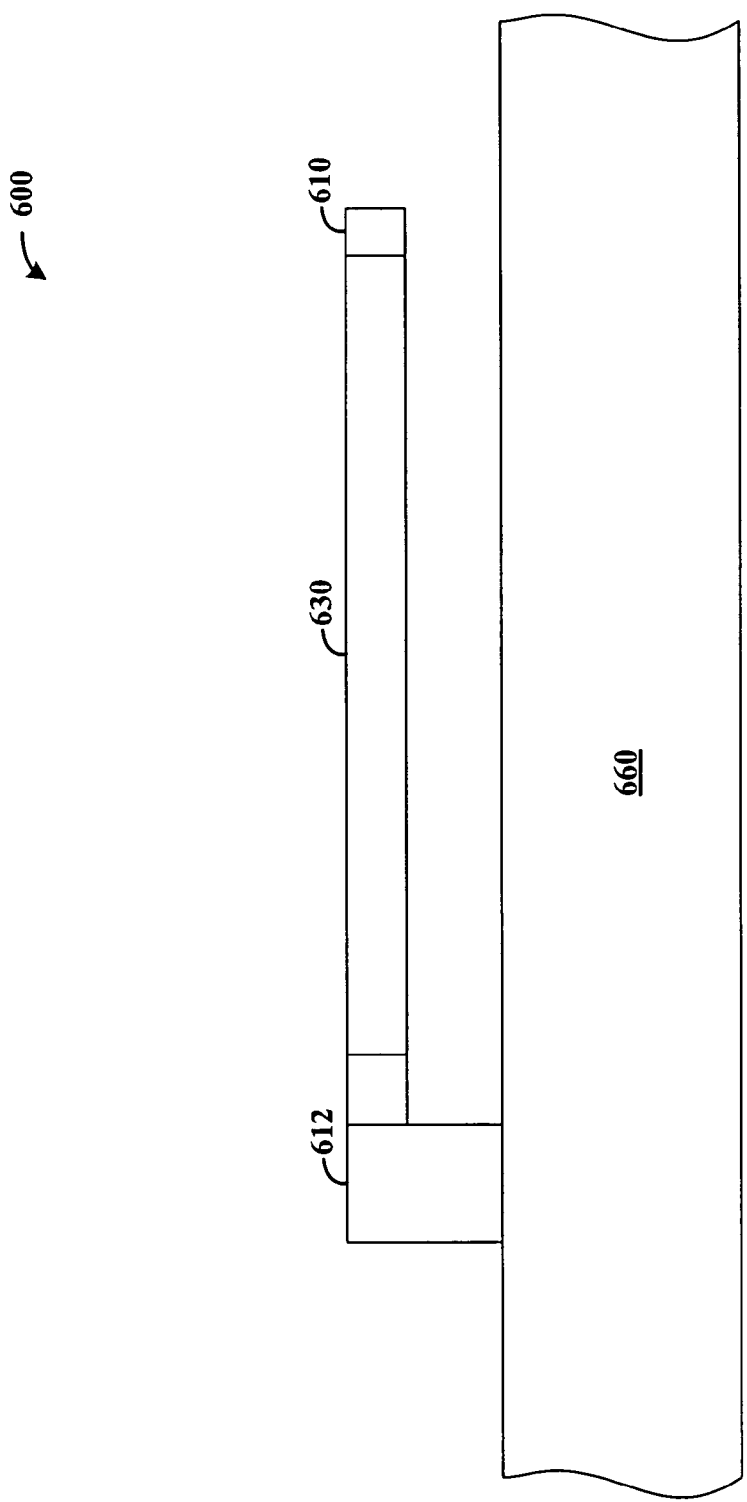

COMPOSITE MECHANICAL TRANSDUCERS AND APPROACHES THEREFOR

STATEMENT REGARDING FEDERALLY-SPONSORED RESEARCH OR DEVELOPMENT

This invention was made with Government support under Contract No. N66001-03-1-8942 awarded by the Space and Naval Warfare Systems Center. The U.S. Government has certain rights in this invention.

FIELD OF THE INVENTION

The present invention relates generally to mechanical transducers, and more particularly to temperature compensation with mechanical transducers.

BACKGROUND

Heat can be an important issue in a variety of mechanical transducer applications, including electrical applications and others, are related to pressure sensors, resonator structures and other frequency-reference devices. For example, in semiconductor applications, circuits often generate a significant amount of heat due to a variety of operational conditions, physical conditions (e.g., close proximity, lack of cooling) and other conditions. Such heat can introduce a variety of undesirable operational conditions, introducing performance and reliability issues. In addition, variation in temperature, whether via heating or cooling, can affect the operating temperature of devices and, accordingly, the performance thereof.

One type of electrical application subject to such temperature-related conditions involves resonators. For instance, the mechanical resonant frequency of devices constructed from Silicon varies with temperature. Accordingly, resonators implementing Silicon have experienced temperature-related changes in resonant frequency.

In many resonator applications, a variety of approaches have been implemented for addressing, controlling or otherwise compensating for temperature. Generally, temperature compensation methods for resonators have been classified as active or passive. Many active compensation techniques use power in order to reduce the temperature coefficient of frequency (TCF) into the desirable range. For instance, voltage has been applied to alter the resonant frequency of a resonator. Passive compensation approaches have used non-powered approaches to tune the resonant frequency of resonator materials, such as those involving the introduction of different materials to a particular type of resonator.

While previous approaches to addressing heat (and temperature) related issues have been implemented, controlling or otherwise compensating for temperature changes in resonators continues to be challenging. For example, approaches involving the introduction of materials with mismatched CTE's may introduce stress induced hysteresis, processing difficulties due to large thermal stresses, restrictions on material selection for clean processes and CMOS compatibility, and undesirable sensitivity to package stress.

These and other characteristics have been challenging to the implementation and manufacture of resonators.

SUMMARY

The present invention is directed to overcoming the above-mentioned challenges and others related to the types of applications discussed above and in other applications. These and other aspects of the present invention are exemplified in a number of illustrated implementations and applications, some of which are shown in the figures and characterized in the claims section that follows.

Various aspects of the present invention are applicable to the implementation of materials having different materials to facilitate temperature compensation with resonators, to selectively set (e.g., tune) the resonant frequency and/or stiffness of resonant structures.

According to an example embodiment of the present invention, a mechanical transducer arrangement includes first and second materials exhibiting respective TCE (temperature coefficient of Young's Modulus) and arranged in relative quantity and position, as a function of their respective TCE values, to form a structure that mitigates fluctuation in mechanical stiffness over a temperature range. With this approach, fluctuation in mechanical stiffness of the first material over said temperature range is mitigated.

According to another example embodiment of the present invention, a resonant structure includes a structural material and a compensation material. The structural material is susceptible to temperature-related fluctuation in resonant frequency. The compensation material is coupled to the structural material and has a TCE, shape and arrangement, relative to the structural material, that passively mitigate temperature-related fluctuation in resonant frequency exhibited by the structural material. In some applications, the TCE, shape and arrangement of the compensation material are such that a composite structure including the structural material and the compensation material exhibits a TCF that is generally stable (e.g., at zero or other selected value) over a temperature range.

In another example embodiment of the present invention, a resonator arrangement includes a composite resonant structure exhibiting a consistent resonant frequency over temperature. The resonant structure includes first and second materials each having a composition, shape and respective TCE, arranged relative to one another, to passively mitigate temperature-related fluctuation in resonant frequency. An anchor couples the resonant structure to an underlying substrate over which the resonant structure extends (e.g., in a cantilever-type arrangement). An electrical circuit is arranged and coupled to the resonant structure to apply a bias thereto. The resonant structure responds to the bias by resonating at a resonant frequency that is substantially consistent over an operational temperature range of the resonator arrangement.

According to another example embodiment of the present invention, a mechanical transducer is manufactured in a manner that facilitates passive mitigation of fluctuation in mechanical stiffness of the transducers. A structural material susceptible to temperature-related fluctuation in mechanical stiffness is formed. A compensation material is coupled to the structural material, such as by forming the compensation material on or around the structural material, or forming the compensation material immediately adjacent thereto. The TCE, shape and arrangement of the compensation material are selected relative to the structural material to passively mitigate the temperature-related fluctuation in mechanical stiffness exhibited by the structural material. In some applications, the TCE, shape and arrangement of the compensation material are selected to create a resultant composite structure with the structural material exhibiting a TCF that is generally stable (e.g., at zero or other selected value) over a temperature range.

The above summary is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention that follows in connection with the accompanying drawings in which:

FIG. 6B shows side view of the single-anchor, double-ended tuning fork resonator arrangement of FIG. 6A anchored to a substrate in accordance with another example embodiment of the present invention.

Figure 1:
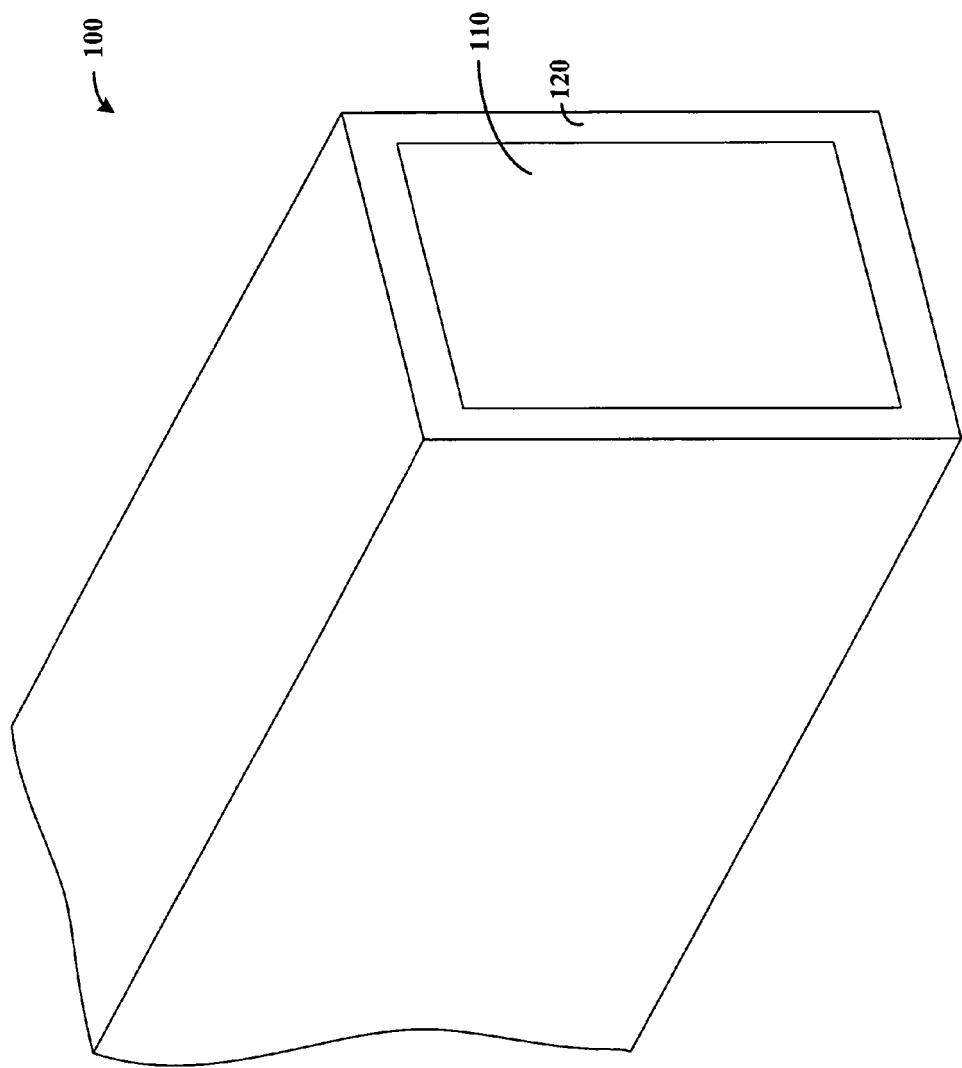
FIG. 1 shows a cross-sectional view of a composite resonant structure, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be applicable to a variety of different types of devices and processes, and the invention has been found to be particularly suited for implementation with mechanical transducers such as resonators, other frequency-reference devices or pressure sensors. While the present invention is not necessarily limited to such applications, various aspects of the invention may be appreciated through a discussion of examples using this context.

According to an example embodiment of the present invention, a composite mechanical transducer structure includes a combination of materials selected and arranged to facilitate substantially consistent mechanical stiffness over a temperature range. In one application, the mechanical transducer includes at least two materials having respective TCE values (temperature coefficient of Young's Modulus values) that are opposite in sign. The amount, thickness and relative placement of the at least two materials are selected to achieve a resultant structure that exhibits relatively consistent mechanical stiffness over a predetermined temperature range (e.g., relative to a variation in mechanical stiffness of one of the at least two materials over temperature). For instance, where the mechanical transducer is a resonant structure, the relatively consistent mechanical stiffness facilitates a resonant frequency of the structure that is correspondingly stable over the temperature range. In some applications, the resultant TCF of the composite structure is substantially consistent (e.g., varies less than about 1 ppm/° C.) over a desired value configured for a predetermined temperature range, and in other applications, the TCF is substantially zero (e.g., in a range of −1 to +1), and/or set to a desired value. In this regard, the mechanical stiffness of the resonant structure is generally stabilized over a temperature range (e.g., over a predetermined temperature range, for example a temperature range which is common for electrical device applications, such as between about 0° C. and +70° C., or for other applications, such as −50° C. to +85° C.).

According to another example embodiment of the present invention, the native temperature coefficient of frequency (TCF) of a resonator material is controlled and/or substantially reduced (i.e., in absolute value) via a composite material including the resonator material and a compensation material. In some contexts, native refers to that exhibited by a single ordinary material, such as quartz, silicon, or other materials. The compensation material exhibits a TCE value that is opposite in sign, or otherwise different in TCE value from the resonator material. In some applications, the TCF of the composite resonator is substantially reduced to about half of the TCF of the resonator material, and in other applications, substantially reduced to less than about 1 ppm/° C. The resonator exhibits a bending stiffness that has reduced sensitivity to temperature relative, for example, to the resonator material (e.g., a Silicon-based resonator). In one implementation, the composite material includes a first material that exhibits softening with increasing temperature and a second material that exhibits hardening with increasing temperature (e.g., exhibits hardening).

In one implementation, a resonant structure includes a Silicon-Silicon Dioxide (Si—$SiO_2$) composite structure that exhibits softening with increasing temperature and Silicon dioxide material that exhibits hardening with increasing temperature. In one application, the Silicon dioxide material is on an outer portion of the Silicon. In another application, the Silicon dioxide substantially surrounds the Silicon (e.g., where the Silicon dioxide is formed on an outer wall of the Silicon). In still another application, the Silicon dioxide is inside or otherwise within the Silicon. For example, the silicon and silicon dioxide may be arranged in one or more layers vertically or laterally throughout the cross-section of the resonator, where the position and thicknesses of the layers are selected so as to reduce and/or minimize the TCF over a predetermined temperature range, or to achieve a predetermined TCF value over a predetermined temperature range.

According to another example embodiment of the present invention, a single-anchored resonator is implemented with a composite material exhibiting characteristics as described with the Si—$SiO_2$ material above. A portion of the resonator is anchored to an adjacent material (e.g., an adjacent substrate) and another portion of the resonator is suspended over the adjacent material, supported via the anchor. With such applications, the single-anchor approach mitigates the coupling of stresses in the resonator with stresses in the substrate or other material to which the resonator is coupled.

In another example embodiment of the present invention, a resonant structure using two materials to facilitate a near-zero TCF is controlled to mitigate drift. In some applications, such drift is frequency drift associated with temperature over time. In other applications, such drift is attributed to the migration of absorbents off of the resonant structure. In the latter application, the drift is mitigated using, for example, electrical and/or heat application to the resonant structure.

In another example embodiment of the present invention, composite resonators are fabricated in a wafer-scale encapsulation process, according to another example embodiment of the present invention. A resonant structure is etched from a substrate such as silicon, exposing a suspended portion of the resonant structure having a first type of material within the substrate. A second type of material is formed on the suspended portion of the resonant structure such that the first and second materials facilitate a relatively consistent resonant frequency of the structure over temperature (e.g., relative to the variation in resonant frequency of one of the at least two materials over temperature). The second material may be formed using, for example, a deposition approach such as chemical vapor deposition (CVD) or oxidation. In some applications, the first and second materials are arranged to facilitate a resultant TCF of the resonant structure that is near zero over a predetermined temperature range. Alternatively, the first and second materials may be arranged to facilitate a resultant TCF to a predetermined value that is substantially different from zero over a predetermined temperature range. After the second material is formed, the exposed suspended resonant structure is sealed, leaving an open area adjacent the resonant structure (e.g., with the open area being a vacuum or near-vacuum, or containing a gas or mixture of gasses).

Turning now to the figures, FIG. 1 shows a cross-sectional view of a composite resonant structure 100, according to an example embodiment of the present invention. The composite resonant structure 100 includes at least two materials 110 and 120, with the material 120 formed on an outer portion of the material 110. Each of the materials 110 and 120 exhibit a TCE (Temperature Coefficient of Young's Modulus) that contributes to characteristics of the resonant structure 100 that facilitate generally consistent resonant performance over temperature. In some applications, the TCE of the material 110 is opposite in sign to the TCE of the material 120. The quantity and arrangement of the materials 110 and 120 is such that the composite resonant structure 100 exhibits a relatively low TCF (temperature coefficient of frequency), and in some applications, a TCF near zero.

While shown in a generally rectangular beam-type shape, the cross-sectional shape of one or both of the materials 110 and 120 are varied to suit different applications. For instance, other polygons, ovals, circles or irregular shapes are implemented for a variety of approaches. The shape, as well as quantity and relative arrangement of the materials 110 and 120, are considered in achieving a desirable TCF.

In addition, the approaches described with FIG. 1 and otherwise herein are selectively implemented with a variety of types of resonators, such as bulk resonators, resonators that exhibit other modes (e.g., wine glass or breathing modes), with modes of vibration not limited to flexural bending. In some applications, the top view of these resonator types are circular or rectangular disk-shaped. Resonant device may include, for example, resonant sensors, electro-mechanical filters or other devices whose performance depends upon the mechanical stiffness of its structures.

In one implementation, the composite resonant structure 100 is adapted for single-anchored applications (e.g., with a single portion or end of the structure 100 anchored to a base or other structure, for example the substrate). The following discussion involves one approach to achieving such a TCF with a single-anchored application employing a beam-type resonator as shown in FIG. 1.

Flexural mode beam-type resonators that are fabricated from a single material and are single-anchored have a frequency and TCF described in Equations 1A and 1B, with Equation 1B ignoring the smaller effect of dimensional changes with temperature and assuming linear material properties.

$$f = \frac{\beta^2}{2\pi L^2}\sqrt{\frac{B}{\rho A}} = \frac{\beta^2}{2\pi L^2}\sqrt{\frac{EI}{\rho A}} \quad \text{(Equation 1A)}$$

$$TCF = \frac{1}{f_o}\frac{\partial f}{\partial T} \approx \frac{1}{2}\frac{\partial f}{\partial B}\frac{\partial B}{\partial T} \approx \frac{TCE}{2} \quad \text{(Equation 1B)}$$

In the above equations, $\beta$ is the mode constant, E is the Young's Modulus, $\rho$ is the density of the material, I is the flexural rigidity (or second moment of inertia), L is the length of the beam, A is the cross sectional area of the beam, B=EI is defined as the bending stiffness of the beam, $f_o$ is a reference (or desired operating) frequency, and TCE is the temperature coefficient of Young's modulus of the beam's material.

For a composite beam of N materials such as the resonant structure 100 in FIG. 1, the above equations are modified such that the bending stiffness takes into account the geometric composition of the beam, wherein $$B = \sum_{j=1}^{N} E_j I_j \text{ and} \quad \text{(Equation 2A)}$$

$$TCF \approx \frac{1}{2}\left[\sum_{j=1}^{N} E_j I_j TCE_j \Big/ \sum_{j=1}^{N} E_j I_j\right] \quad \text{(Equation 2B)}$$

The resulting TCF of the composite resonant structure 100 is a function of the TCE of each of the materials 110 and 120, as well as their quantity and arrangement. For example, the materials 110 and 120 may be arranged in a series of alternating layers from top to bottom, or from left to right, where the thicknesses and arrangements of the layers are selected to achieve a predetermined TCF over a predetermined temperature range.

In one implementation, the material 110 is Silicon and the material 120 is $SiO_2$, with the $SiO_2$ formed via oxidation of the Silicon surface, or otherwise deposited on the surface of the Silicon. The TCE of Silicon is approximately −60 ppm/° C. which results in a TCF of −30 ppm/° C. for Silicon resonators. The $SiO_2$, which has a positive TCE of +195 ppm/° C., in combination with Silicon facilitates a bending stiffness of the composite resonant structure 100 that is generally consistent over temperature, yielding an (about) zero TCF resonator.

Referring to Equation 2B above, a design parameter that can be controlled is the flexural rigidity (I) of each material in a particular resonant structure. For a Si—$SiO_2$ composite beam as in the above example discussed in connection with FIG. 1, the $SiO_2$ growth of the material 120 is implemented to achieve a low or near-zero TCF.

As relevant to the above example involving a composite structure of Silicon and amorphous $SiO_2$, a variety of other material combinations are implemented in a similar manner with two or more materials making up a composite structure. For instance, one or more of Germanium Oxide, Silicon nitride, aluminum nitride and hafnium oxide are selectively used with such a structure in place of and/or in addition to $SiO_2$ as a temperature-compensating material. Similarly, other materials such as single-crystal semiconductor materials, CMOS type materials, clean process materials, Silicon-Germanium (SiGe), Silicon, quartz and Germanium Arsenide (GeAs) are selectively used with such a structure in place of and/or in addition to Silicon. In some applications, one or more such materials are implemented in a resonator having a non-zero TCF.

Figure 2:
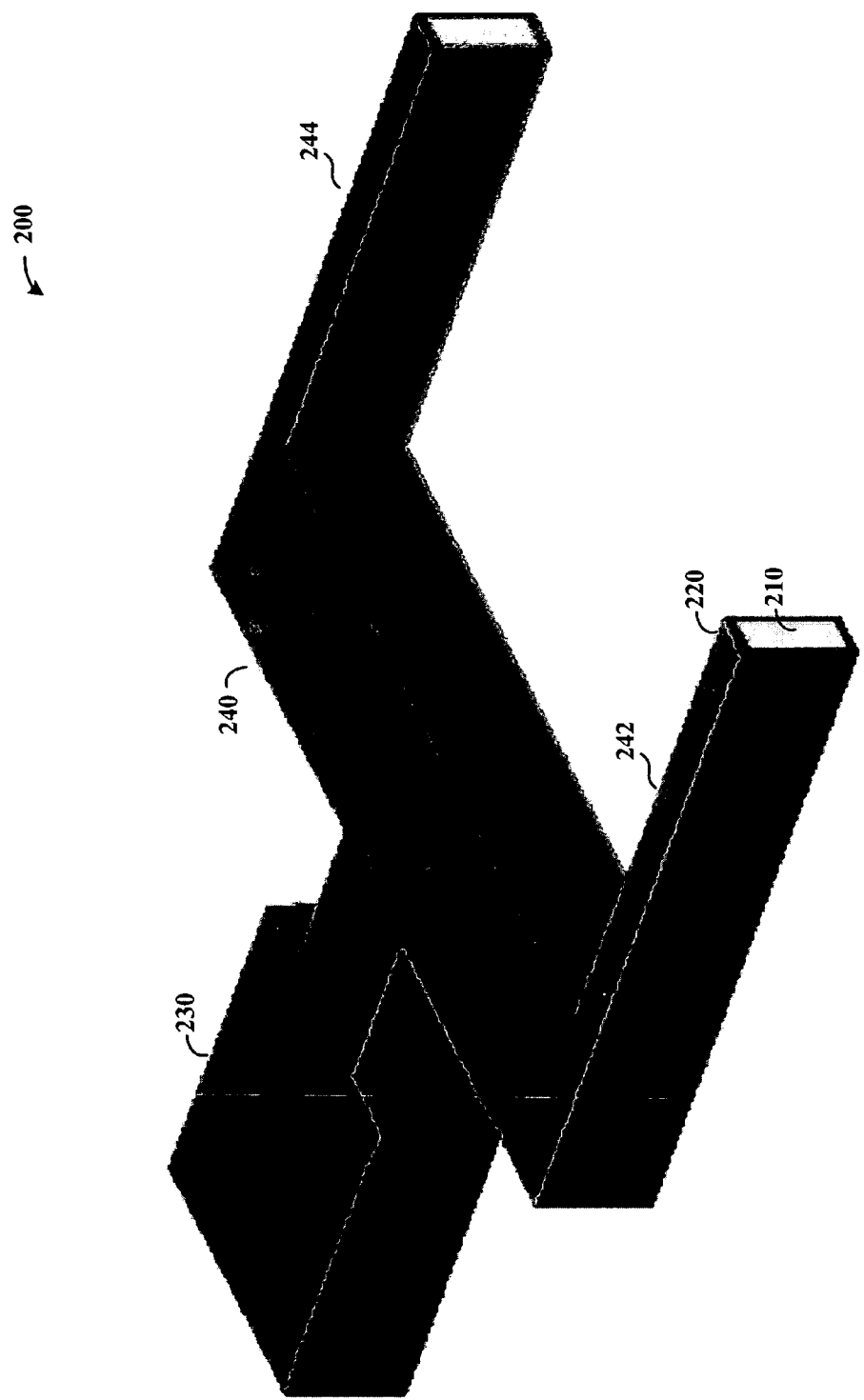
FIG. 2 shows a resonator arrangement, according to another example embodiment of the present invention.

FIG. 2 shows a double-ended tuning fork (DETF) resonator arrangement 200, according to another example embodiment of the present invention. The arrangement 200 includes an anchor region 230 for coupling to a support structure such as a substrate underlying the arrangement 200, a lateral structure portion 240 and two composite beams 242 and 244. In each of these embodiments, the resonating structure is connected to the substrate at a single location. By anchoring the device at a single location, thermal expansion of the substrate, or other strains applied to the substrate by package materials or other external influences do not introduce stresses into the resonator that might cause additional changes in frequency.

The composite beams 242 and 244 each include an inner material 210 and an outer material layer 220 on the inner material. This arrangement may be implemented in a manner similar to that shown in FIG. 1 and discussed above. Each of the inner and outer materials 210 and 220 have respective TCE characteristics that contribute to a resultant TCF of the respective beams 242 and 244 that facilitates desirable resonant behavior over a predetermined range of temperatures, and in some applications, that is a zero or near-zero TCF (i.e., set to a selected value for a particular application).

In some applications the inner material may have a positive TCE and the outer material may have a negative TCE. Alternatively, the inner material may have a negative TCE, and the outer material may have a positive TCE. The position of the positive and negative TCE materials and the relative thickness of these two materials is selected so as to achieve a TCF substantially near zero over a predetermined temperature range. Alternatively, the position and thickness of the positive and negative TCF materials can be selected to achieve a TCF that is substantially different from zero within a predetermined temperature range.

Generally, each composite beam has a quartic dependence on thickness of the outer material layer 220. In this regard, the TCF of the composite beams 242 and 244 depends upon the thickness of the outer material 220, and the flexural rigidity (I) of the materials relates to the resultant TCF as discussed above and is sensitive to the thickness of the material.

In one implementation involving the DETF resonator arrangement 200, the inner material 210 of the composite beams 242 and 244 is a Silicon material such as crystalline silicon, polycrystalline silicon, or amorphous silicon, and the outer material layer 220 is $SiO_2$ coated on the Silicon 210 by oxidation of surfaces thereof. The flexural rigidity of the $SiO_2$ material ($I_{SiO_2}$) is given as $$I_{SiO_2} = \frac{(h+2t)(w+2t)^3}{12} - \frac{hw^3}{12}, \quad \text{(Equation 3)}$$

wherein
t=thickness of the $SiO_2$,
w=width of the Silicon beam material 210, and
h=height of the Silicon beam material 210.

Figure 3:
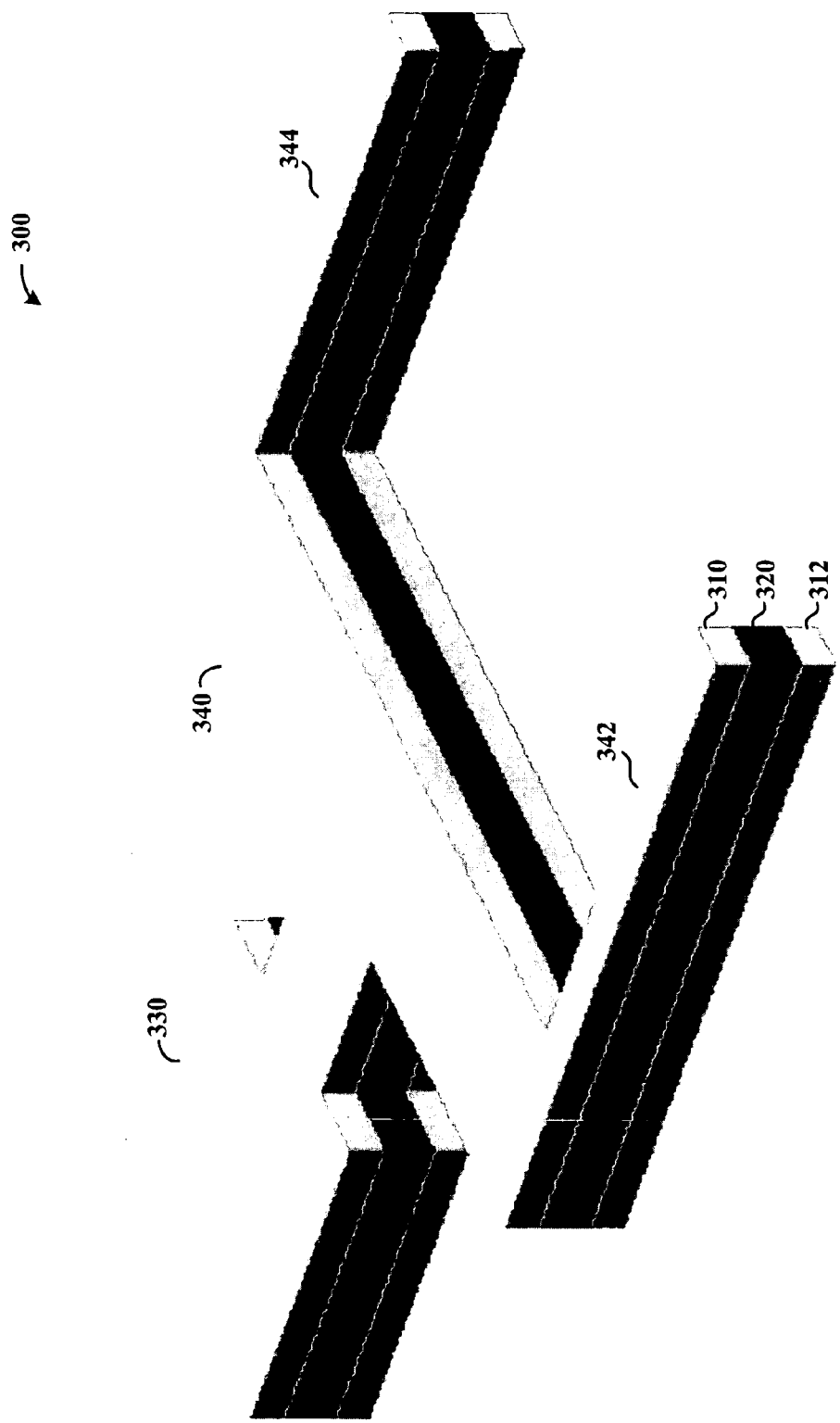
FIG. 3 shows a resonator arrangement, according to another example embodiment of the present invention

FIG. 3 shows a DETF resonator arrangement 300, according to another example embodiment of the present invention. The arrangement 300 is similar in shape to the DETF resonator arrangement 200 in FIG. 2, with a single base or anchor region 330 for coupling to a support structure, a lateral structure portion 340 and two composite beams 342 and 344 (labeled similarly to the arrangement 200 of FIG. 2 for discussion purposes).

The composite beams 342 and 344 each include an inner material 320 between two outer material layers 310 and 312. The inner (320) and outer materials (310, 312) form a laminate-type structure exhibiting a flexural rigidity that is linearly related to the thickness of each layer (e.g., defined in a vertical direction as shown in FIG. 3). In some applications, the TCF of the composite beams 342 and 344 is selectively set via the thickness of the inner material 320; in other applications, different characteristics of the composite beams are modified (e.g., while holding the thickness and/or other characteristics constant) to set the TCF of the composite beams.

In one implementation involving the DETF resonator arrangement 300, the outer material 310 and 312 of the composite beams 342 and 344 is a Silicon material, and the inner material 320 is $SiO_2$. The flexural rigidity of the $SiO_2$ material ($I_{SiO_2}$) is given as $$I_{SiO_2} = \frac{tw^3}{12}, \quad \text{(Equation 4)}$$

wherein
t=thickness of the $SiO_2$, and
w=width of the beam.

Figure 4:
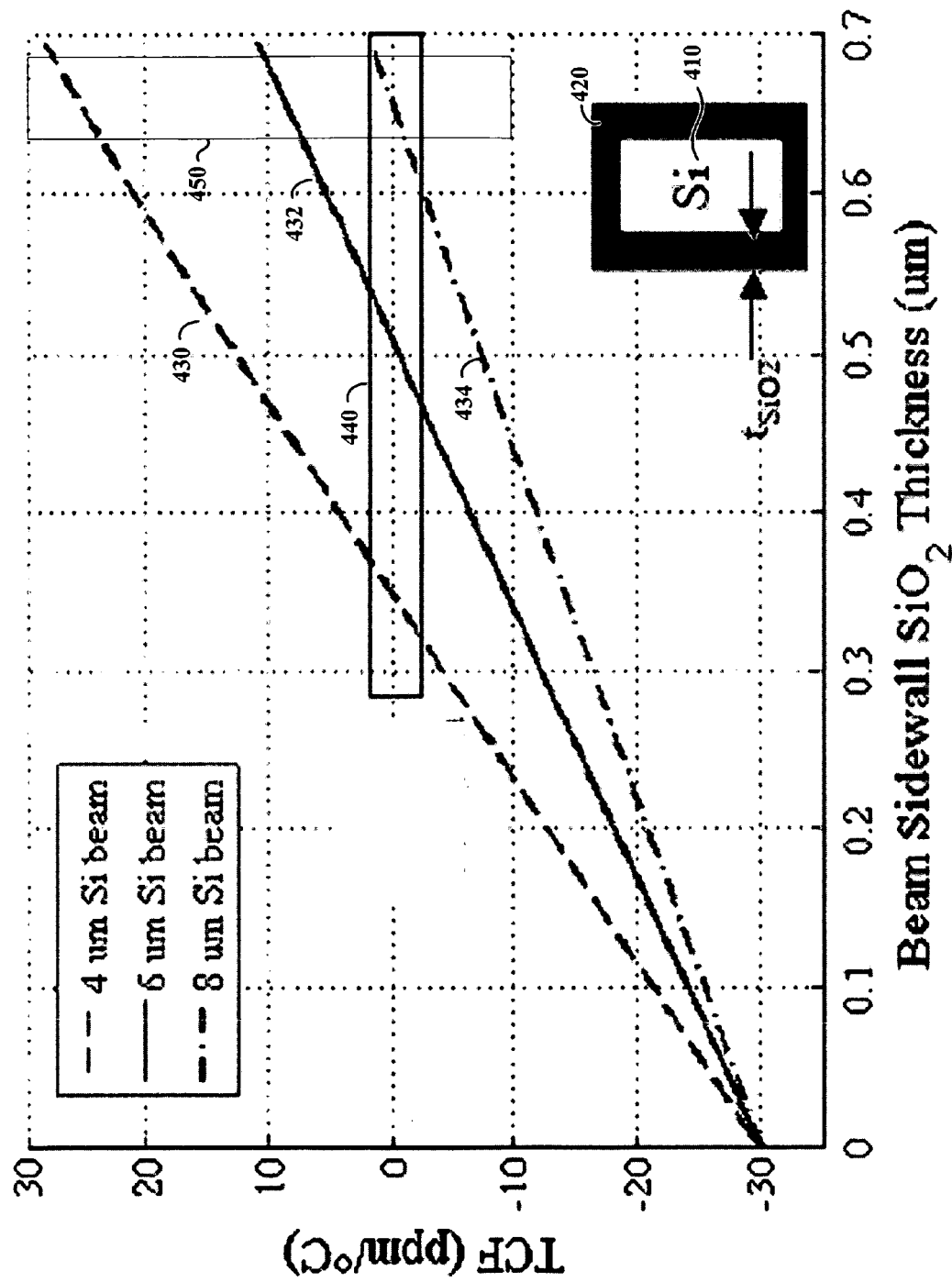
FIG. 4 shows a graphical approach to selecting and implementing material thickness in a rectangular-profile resonator beam arrangement, according to another example embodiment of the present invention.

FIG. 4 shows a graphical approach to selecting and implementing material thickness in a rectangular resonator beam arrangement using Silicon as a base material and $SiO_2$ as a coating, according to another example embodiment of the present invention. The approach shown in FIG. 4 is applicable, for example, to a resonant structure such as that shown in FIG. 1, with the materials 410 (Silicon) and 420 ($SiO_2$) in FIG. 4 respectively corresponding to the materials 110 and 120 in FIG. 1.

The graph in FIG. 4 shows beam sidewall thickness (material 420), here implemented with $SiO_2$, with beam sidewall thickness (of the $SiO_2$ material 420) in micrometers on the horizontal axis, and TCF (ppm/° C.) on the vertical axis. Three plots 430, 432 and 434 are shown, respectively with 4, 6 and 8 micrometer silicon beams (material 410). The plots 430, 432 and 434 are obtained using Equation 2B. The target oxidation (thickness of $SiO_2$) depends on the initial width of the Silicon 410.

In one embodiment, for the case of a silicon beam with a silicon dioxide coating, silicon dioxide coating is formed on all surfaces with thickness that is between 5% and 10% of the width of the silicon beam, resulting in a resonator TCF that is substantially near zero about a predetermined temperature range. In another embodiment, a silicon dioxide coating that is more than 10% of the width of the silicon beam is formed on all surfaces that are less than 5% of the width of the silicon beam, resulting in a resonator TCF that is positive and substantially greater than zero over a predetermined temperature range. In another embodiment, a silicon dioxide coating that is less than 5% of the width of the silicon beam is formed on all surfaces, resulting in a resonator TCF that is negative and substantially less than zero over a predetermined temperature range. Controlling the ratio of the oxide thickness relative to the silicon thickness allows formation of the resonators that have TCF substantially near zero (e.g., a TCF value between about ±1 of 0) over a predetermined temperature.

In one example embodiment, a resonator with a final oxide film thickness that is 8.5% of the final silicon beam width is implemented for a resonator with a TCF substantially near zero. In some applications, a resonator with a predetermined ratio of oxide film thickness to silicon beam width, is fabricated by etching a silicon beam in a functional layer of the device with an initial width that is slightly greater than the predetermined final silicon beam width, and allowing for the consumption of some amount of the silicon by the formation of the oxide in an oxidation process.

The plots 430, 432 and 434 address the orientation-dependent oxidation of the beam surfaces (of Silicon 410) as well as the consumption of Silicon during oxidation (e.g., about 0.46 μm of Silicon for 1 μm of $SiO_2$). In addition, the constants used in FIG. 4 with Equation 2B are:

$TCE_{Si}$=−60 ppm/° C.,
$TCE_{SiO_2}$=+195 ppm/° C.,
$E_{Si}$=168 GPa,
$E_{SiO_2}$=70 GPa, and
h=20 μm.

Continuing to refer to FIG. 4, a region 440 corresponds to a thickness or thickness range of the $SiO_2$ material 420 ($t_{SiO_2}$) that facilitates a predetermined TCF of the beam that is substantially zero TCF of the beam (e.g., a TCF near zero for a temperature range of −50° C. to +200° C.), in connection with certain example embodiments. For other embodiments, a region 450 corresponds to resonators fabricated with silicon beam widths ranging from about 3 microns to 10 microns, and with silicon dioxide thickness of between 0.64 and 0.69. Resonators fabricated in a manner commensurate with region 450 include those having a TCF substantially near zero for some applications, and for other applications, resonators with TCF values ranging from about 5 ppm/C to more than 25 ppm/C, formed adjacent to one another at the same time in the same fabrication process.

In one embodiment two or more resonators are fabricated adjacent to each other in a single wafer. In some applications, these resonators are manufactured and arranged to produce groups of resonators with substantially equal TCF and frequency values over a predetermined range of temperatures. In other applications, these resonators are manufactured and arranged to produce resonators with different values of TCF over a predetermined range of temperatures. For example, by fabricating sets of resonators with two different silicon widths, and by growing the same oxide film thickness on all resonators, the resultant devices will have two different TCFs. In one particular example, the widths are 8 and 4 microns, and the oxide thickness is 0.35 microns and the resultant TCFs are near 0 ppm/C and near −15 ppm/C for the 8 and 4 micron beams respectively. By selecting the two beam widths and the oxide film thickness, adjacent resonators are fabricated with the substantially different TCF values.

FIGS. 5A-5G show a resonator at various stages of manufacture using a wafer scale epitaxial polysilicon encapsulation (e.g., thin film encapsulation, or layered encapsulation) with oxide seal processes, according to another example embodiment of the present invention. Beginning with FIG. 5A, a silicon wafer 510 has a $SiO_2$ layer 520 formed thereon, with a Silicon layer 530 formed on the $SiO_2$ layer patterned to define vertical sidewalls of resonator structures 532 and 534 of the Silicon (for formation as resonant beams similar to that shown in FIG. 1). The exposed regions near the sidewalls of resonator structures 532 and 534 are filled with a $SiO_2$ material 540 in FIG. 5B, which is also formed over the resonator portions and the remaining Silicon layer 530.

Figure 5A:
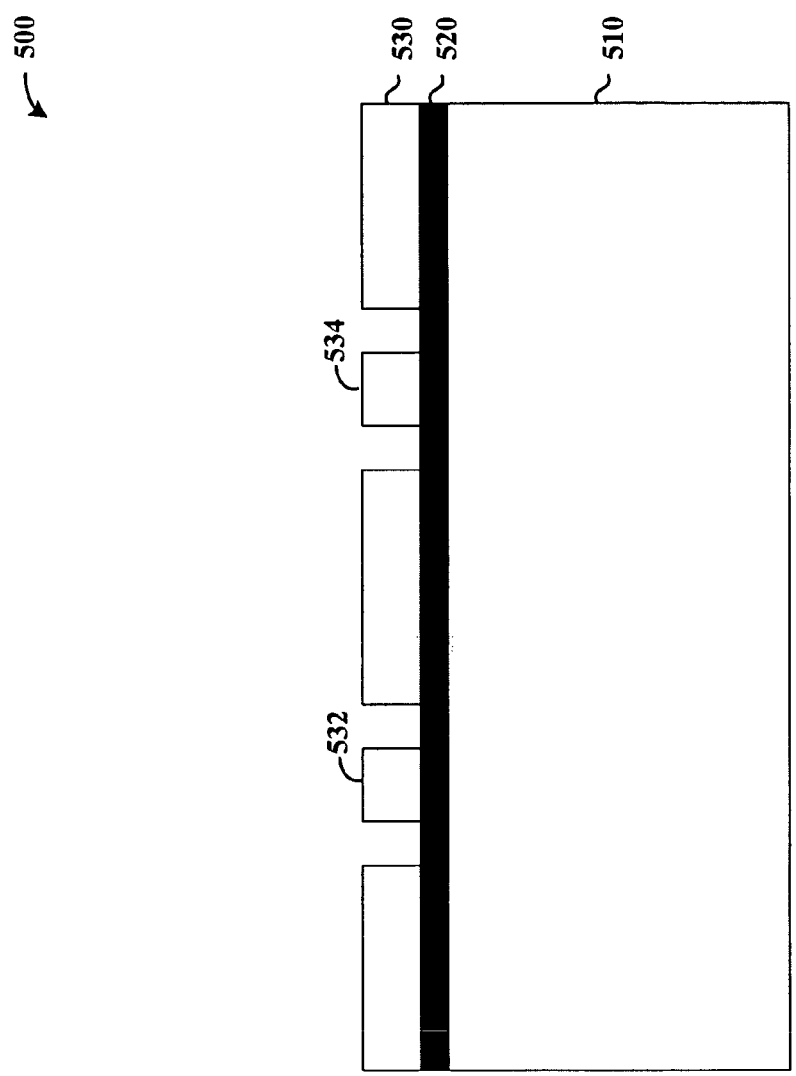
FIG. 5A-5G show a resonator at various stages of manufacture, according to another example embodiment of the present invention.
Figure 5B:
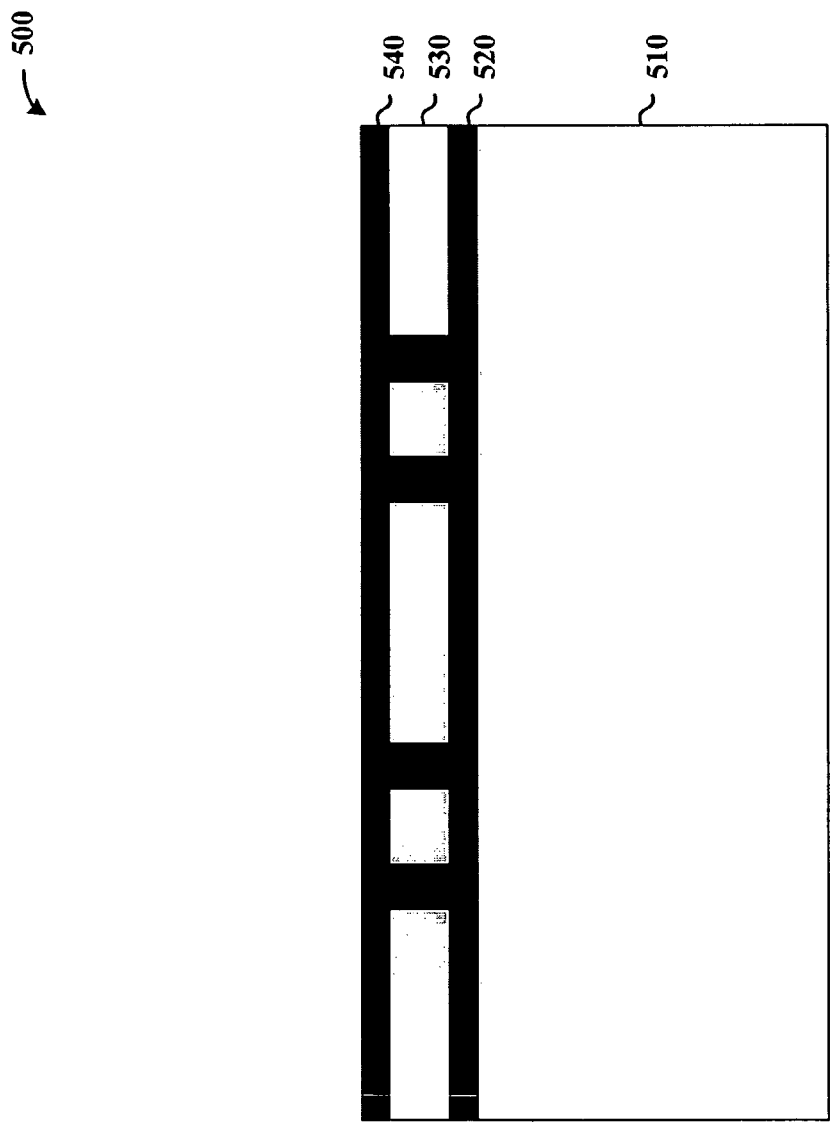
Figure 5C:
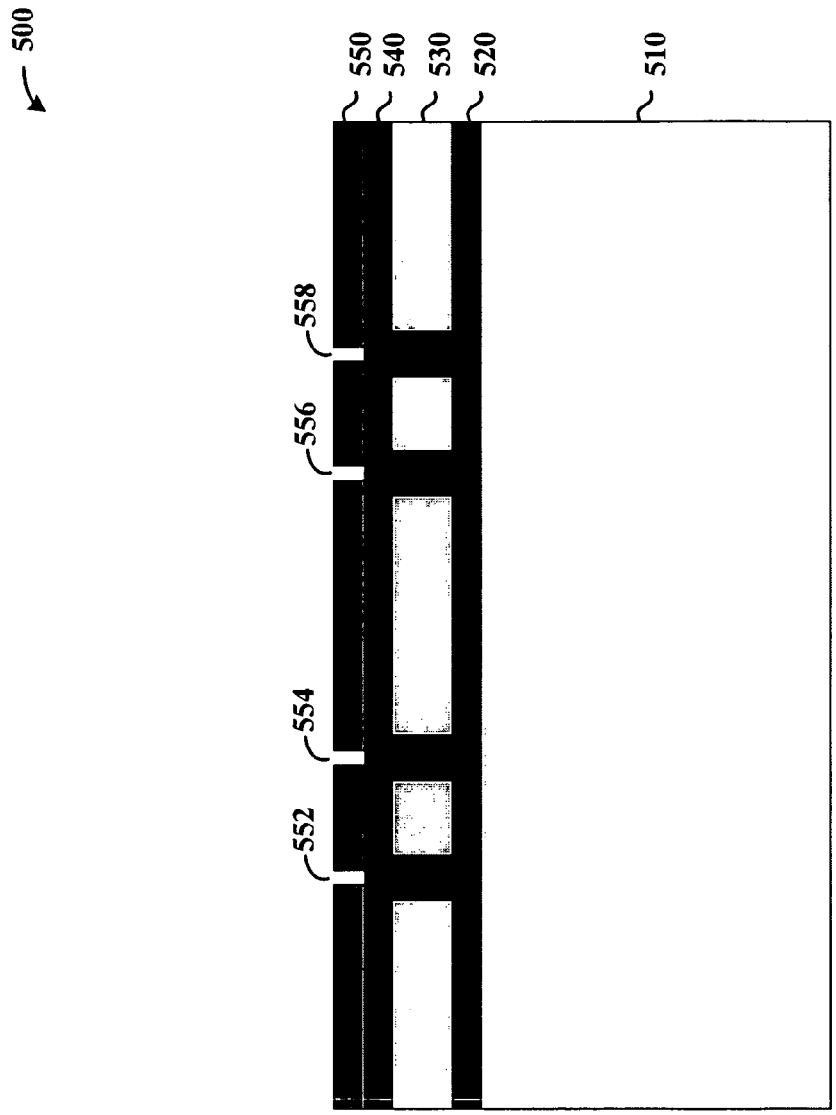
Figure 5D:
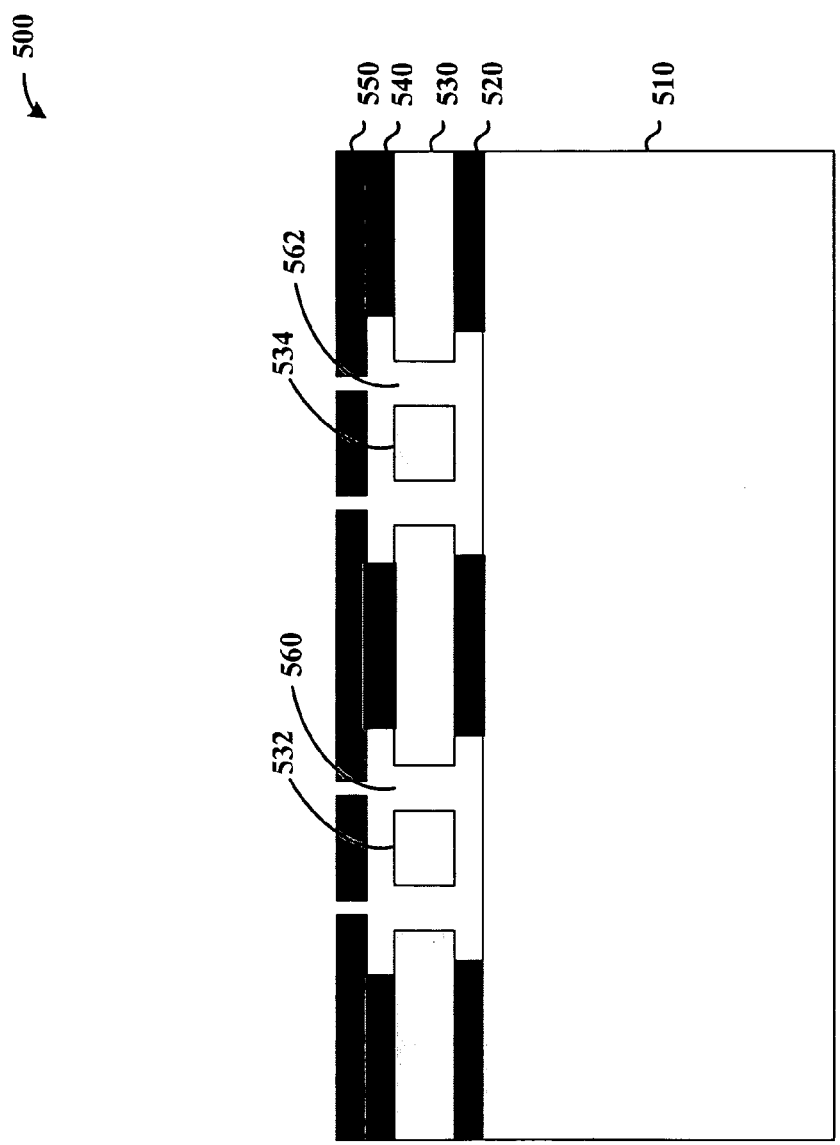

In FIG. 5C, a polysilicon encapsulation layer 550 is formed over the $SiO_2$ material 540, with etch openings 552, 554, 556 and 558 having been made in the polysilicon encapsulation layer. In FIG. 5D, sacrificial $SiO_2$ has been etched using an etch material such as HF vapor, using the etch openings 552-558 to access and etch $SiO_2$ around the resonator structures 532 and 534, resulting in open areas 560 and 562 respectively around the resonator beams.

Figure 5E:
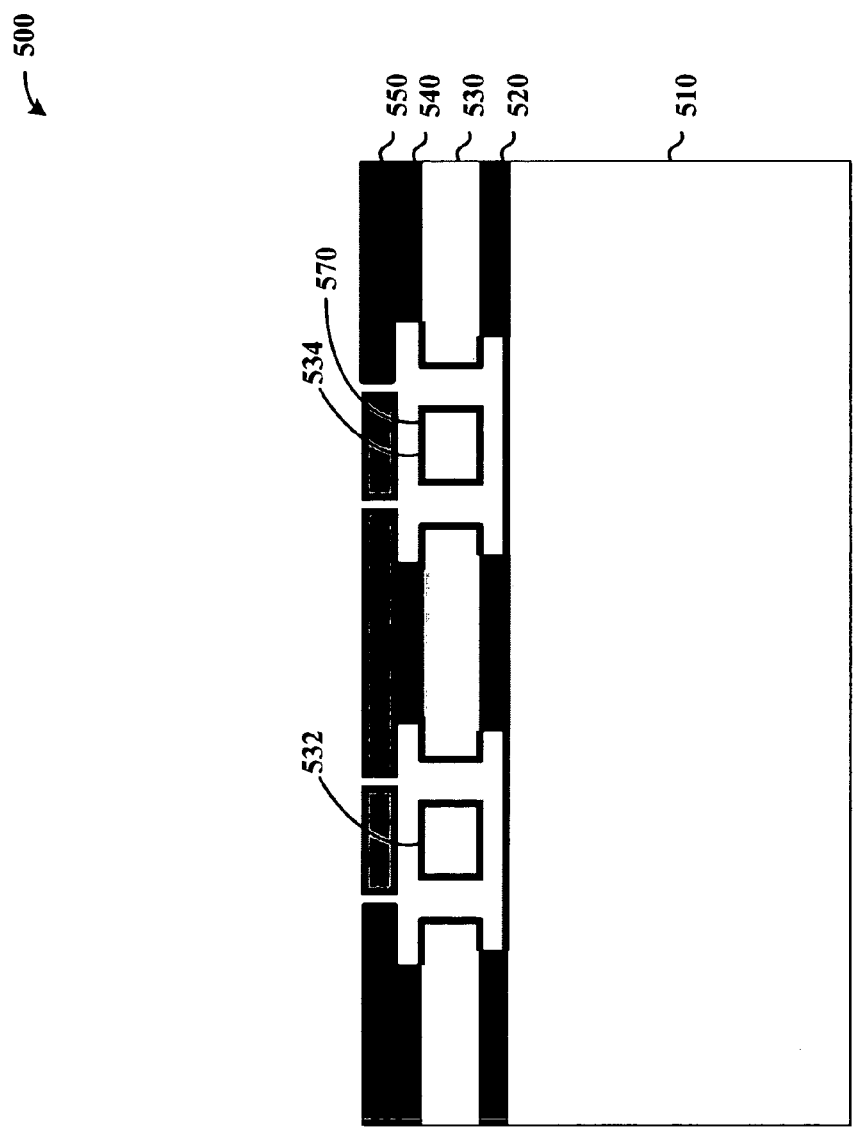
Figure 5F:
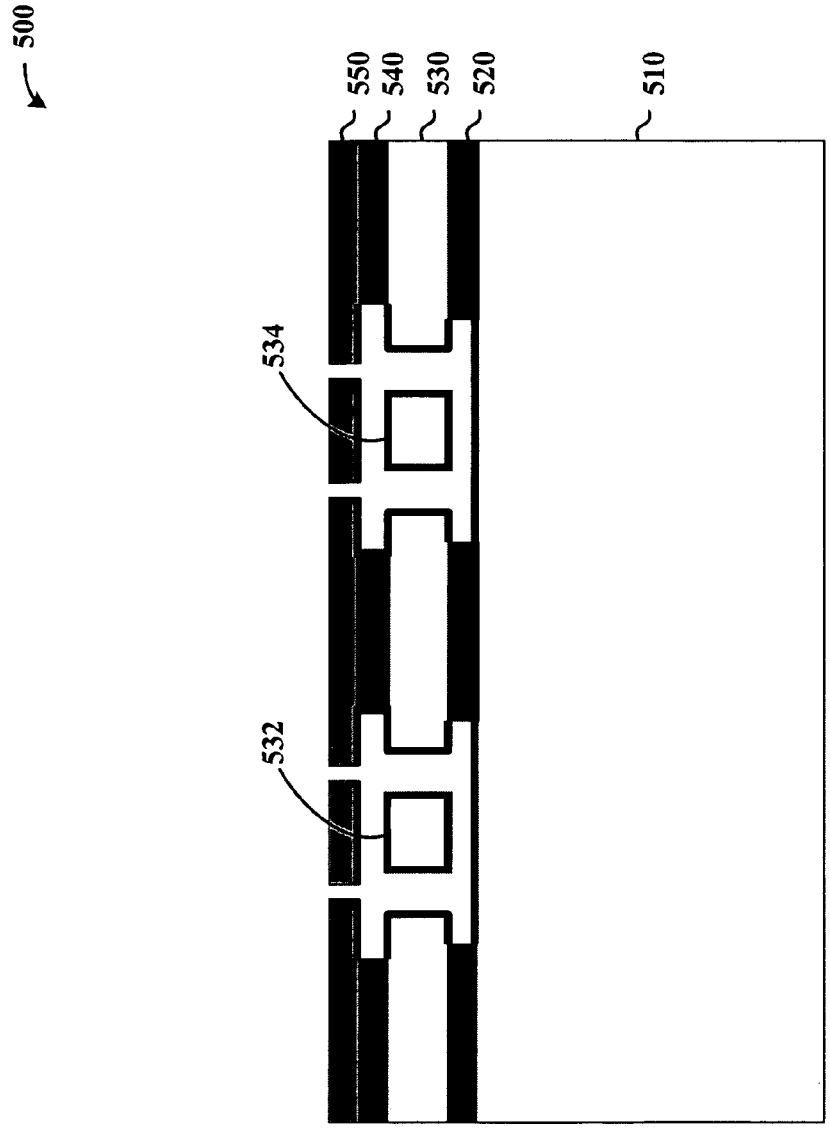

After the sacrificial $SiO_2$ has been etched, $SiO_2$ is grown on exposed surfaces as shown in FIG. 5E. The $SiO_2$ growth is achieved using, for example, a 30 minute wet oxidation at 1100° C., or at one or more of wet or dry applications at a variety of temperatures. The resonating structures 532 and 534 are oxidized, forming $SiO_2$ including $SiO_2$ 570 of resonator structure 534, referenced by way of example. The thickness of the $SiO_2$ 570 is selected in accordance with one or more of the example embodiments discussed above, to achieve a desirable TCF for each resonator structure 532 and 534. $SiO_2$ on the top surface of the polysilicon layer 550 is then etched, with the structure shown in FIG. 5F.

Figure 5G:
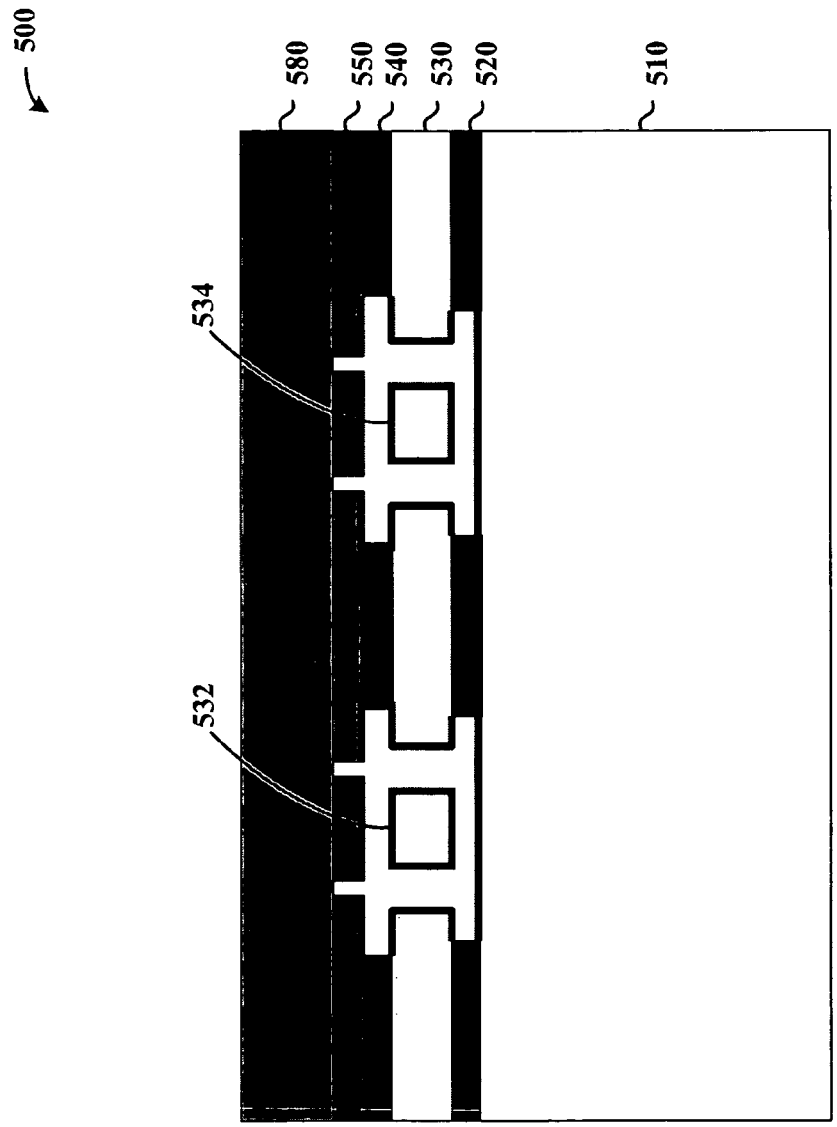

In FIG. 5G, an encapsulation layer 580 of polysilicon is formed on the polysilicon layer 550 to seal the structures 532 and 534. The area around each beam is selectively a vacuum, near-vacuum or includes a selected gas such as an inert gas or mixture of gasses. In some applications, the encapsulation layer 580 is formed of a material other than polysilicon, or in addition to polysilicon, such as an oxide or metal material, or another material formed using, for example, CVD.

While implemented for the manufacture of resonators as shown, the approach discussed in connection with FIGS. 5A-5G is applicable to a variety of shapes, such as oval, square, circular, discs or other polygonal shapes that may be implemented in a variety of forms similar to or very different from beam-like shapes. In addition, while discussed as implemented with Silicon and $SiO_2$, the approach shown in FIGS. 5A-5G is selectively implemented with other materials, respectively selected to facilitate a desirable TCF for structures 532 and 534.

Figure 6A:
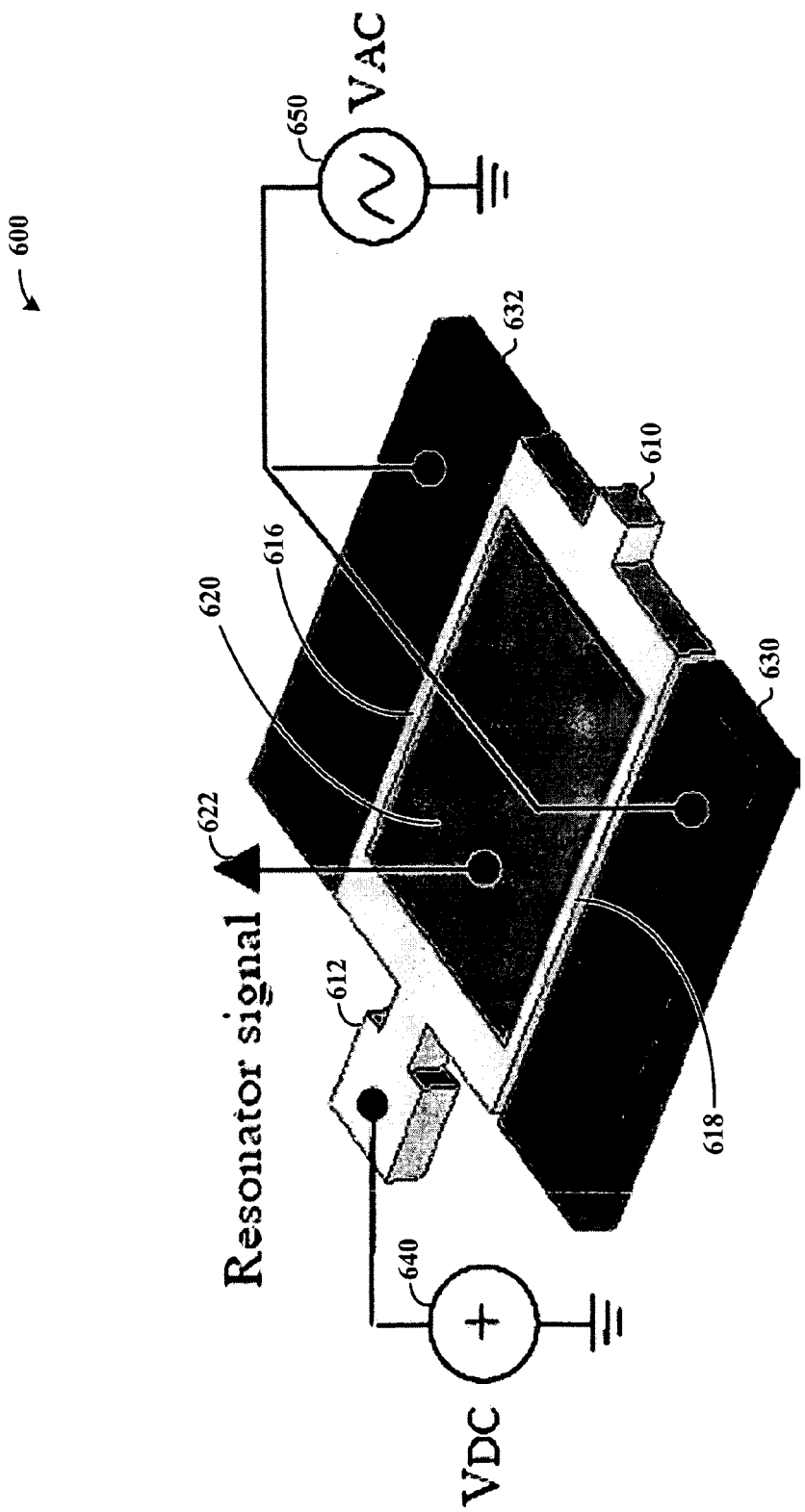
FIG. 6A shows a single-anchor, double-ended tuning fork resonator arrangement, according to another example embodiment of the present invention.

FIG. 6A shows a single-anchor, double-ended tuning fork (DETF) resonator arrangement 600 with outer excitation electrodes 630 and 632, and an inner sense electrode 620, according to another example embodiment of the present invention. The outer electrodes 630 and 632 are coupled to an AC voltage supply $V_{AC}$ 650, with the inner sense electrode 620 providing a resonator signal output 622.

The DETF resonator arrangement 600 includes a DETF having a free end 610 and a fixed end 612 separated by resonator structures 616 and 618. The fixed end 612 supports the DETF, is coupled to an underlying substrate (see, e.g., FIG. 6B) and electrically coupled to a voltage supply $V_{DC}$ 640. Resonator structures 616 and 618 are made up of a composite of at least two materials, such as shown with FIG. 2 or FIG. 3, such that the TCF is near zero and the resonator signal 622 for the DETF resonator arrangement 600 is generally consistent over a temperature range for a given input at $V_{AC}$ 650.

In some applications, an active temperature compensation approach is implemented with passive, TCF-based approaches as described herein, to facilitate the mitigation of temperature-based fluctuation in resonant frequency of the arrangement 600. In some applications, this approach involves applying an electrostatic force via an external electrode in proximity of the arrangement 600. For general information regarding the application of active temperature compensation, and for specific information regarding approaches to the application of an electrostatic force, reference may be made to U.S. Patent Publication No. 20050162239 and to U.S. Pat. No. 6,987,432, both of which are fully incorporated herein by reference.

FIG. 6B shows side view of the single-anchor, double-ended tuning fork resonator arrangement 600 of FIG. 6A anchored to a substrate 660, in accordance with another example embodiment of the present invention. The fixed end 612 is shown extended below that shown in FIG. 6A, to the substrate 660 (e.g., a silicon substrate).

While the present invention has been described with reference to several particular example embodiments, those skilled in the art will recognize that many changes may be made thereto without departing from the spirit and scope of the present invention. Such changes may include, for example, implementing approaches with the various resonant-type structures described above with other applications, such as pressure sensors, mechanical transducers and other frequency-reference devices. In addition, one or more of the various approaches described above may be applied to a resonator of construction other than Silicon, or of materials in addition to Silicon, or other Silicon-based materials. The approaches discussed herein are also selectively used with other temperature compensation arrangements and approaches, including both active and passive approaches, or approaches to mitigating frequency drift over time. Furthermore, the various structures shown may be fabricated and/or otherwise arranged in an array, with a plurality of structures used for a particular application. In addition, the structures are compatible with encapsulation in a hermetic cavity to facilitate stability. These and other approaches as described in the claims below characterize aspects of the present invention.

What is claimed is:

1. An encapsulated resonator arrangement comprising:
    a substrate;
    at least two composite resonant structures, each structure extending over the substrate and including
        a structural material susceptible to temperature-related fluctuation in resonant frequency, the respective composite structures having different structural materials and exhibiting TCF (temperature coefficient of frequency) values that are different over a predetermined temperature range, and
        a compensation material grown on an outer surface of the structural material and having a TCE (temperature coefficient of Young's Modulus) and thickness, relative to the structural material, to passively mitigate the temperature-related fluctuation in resonant frequency in the composite structure;
    for each composite structure, a support structure coupling the composite structure to the substrate at a single location to solely support the composite structure extending over the substrate;
    sidewall material on the substrate and laterally adjacent the composite structures; and
    an encapsulation material over the composite resonant structures and, with the substrate and sidewall material, encapsulating the composite resonant structures.

2. The arrangement of claim 1, wherein one of the composite structures exhibits a TCF having an absolute value that is substantially less than the absolute value of the TCF of the structural material.

3. The arrangement of claim 1, wherein one of the composite structures exhibits a TCF of a set value over an operating temperature range of the one of the composite resonant structures.

4. The arrangement of claim 1, wherein each of the composite structures consists of the respective structural and compensation materials.

5. The arrangement of claim 1, wherein the compensation material of at least one of the composite structures has a TCE, shape and arrangement, selected relative to the TCE, shape and arrangement of the structural material to facilitate a TCF of the composite structure of substantially zero over a predetermined temperature range.

6. The arrangement of claim 1, wherein the compensation material of at least one of the structures has a TCE, shape and arrangement, selected relative to the TCE, shape and arrangement of the structural material to facilitate a TCF of the composite structure that is substantially consistent over an operating temperature range of the encapsulated arrangement.

7. The arrangement of claim 1, wherein at least one of the composite structures consists of the structural material and the compensation material.

8. The arrangement of claim 1, wherein the compensation material of at least one of the structures has a TCE, shape and arrangement, relative to the TCE, shape and arrangement of the structural material that facilitates a resonant frequency of the composite structure that is substantially consistent over an operating temperature range of the encapsulated arrangement.

9. The arrangement of claim 1, wherein a first one of the structural material and the compensation material of at least one of the composite structures exhibits softening with increasing temperature, and wherein the other one of the structural material and the compensation material of the at least one of the resonant structures exhibits a hardening with increasing temperatures.

10. The arrangement of claim 1, wherein the compensation material of at least one of the composite structures is amorphous.

11. The arrangement of claim 1, wherein the compensation material of at least one of the composite structures is a thin oxide layer formed on the structural material.

12. The arrangement of claim 1, wherein the structural material of at least one of the composite structures is Silicon and wherein the compensation material is a thin Silicon Oxide layer oxidized from the Silicon.

13. The arrangement of claim 1, wherein the thickness of the compensation material of different ones of the composite structures is the same, the composite structures having respective TCF values that are different over a predetermined temperature range, the respective compensation materials grown on the different structural materials being configured to passively mitigate the temperature-related fluctuation in resonant frequency in the composite structures over a temperature range that is different for each composite structure.

14. The arrangement of claim 1, wherein the compensation material grown on the structural material of the respective composite structures is grown to the same thickness on each composite structure.

15. The arrangement of claim 1, wherein one of the composite structures includes a structural material that is different in shape than the structural material of the other composite structures, and the thickness of the compensation material on the respective structural materials is the same.

16. The arrangement of claim 1, wherein
    the structural material of one of the composite structures has at least one of a size or shape that is different than that of the structural material of the other composite structure,
    the thickness of the compensation material grown on the respective resonant structures is the same, and
    the respective resonant structures being configured to provide an output for use in temperature control.

17. An encapsulated resonator arrangement comprising:
    at least two resonant structures, each structure comprising structural and compensation materials having a composition, shape and respective TCE (temperature coefficient of Young's Modulus), arranged relative to one another, to passively mitigate temperature-related fluctuation in resonant frequency, the structural and compensation materials in the respective resonant structures being configured and arranged to mitigate temperature-related fluctuation over different temperature ranges;

a substrate underlying the resonant structure;

for each resonant structure, an anchor coupling the resonant structure to the underlying substrate at a single location and therein providing sole support for suspending the resonant structure over the substrate;

sidewalls including electrodes over the substrate an laterally adjacent to resonant structures;

an encapsulation layer over the resonant structures, the encapsulation layer, sidewalls and substrate encapsulating the resonant structures;

an electrical circuit to apply a bias to the resonant structures via the sidewall electrodes; and wherein the resonant structures respectively respond to the bias by resonating at a resonant frequency that is substantially consistent over different operational temperature ranges of the resonator arrangement.

18. The resonator arrangement of claim 17, wherein at least one of the resonant structures responds to the bias by resonating at said resonant frequency at temperatures within an operational range of the resonator arrangement of at least one of between about 0° C. and 70° C., and between about −50° C. and +85° C.

19. The resonator arrangement of claim 17, wherein the TCF (temperature coefficient of frequency) of at least one of the resonant structures is substantially consistent over an operational temperature range of the resonant structures.

20. The resonator arrangement of claim 17, wherein the compensation material of at least one of the resonant structures is an oxide grown on the structural material.

21. The resonator arrangement of claim 17, further including an active temperature compensation circuit adapted to apply an electrostatic field to at least one of the resonant structures.

* * * * *

UNITED STATES PATENT AND TRADEMARK OFFICE
CERTIFICATE OF CORRECTION

PATENT NO. : 7,806,586 B2  
APPLICATION NO. : 11/446568  
DATED : October 5, 2010  
INVENTOR(S) : Melamud et al.

Page 1 of 1

It is certified that error appears in the above-identified patent and that said Letters Patent is hereby corrected as shown below:

Col. 11, line 48, Claim 1: two instances of "composite resonant structures" should read -- composite structures --

Col. 12, line 44, Claim 14: "The arrangement" should read -- The resonator arrangement --

Col. 12, line 48, Claim 15: "The arrangement" should read -- The resonator arrangement --

Col. 13, line 10, Claim 17: "an" should read -- and --

Signed and Sealed this
Twentieth Day of December, 2011

David J. Kappos
*Director of the United States Patent and Trademark Office*